United States Patent
Oshima et al.

(10) Patent No.: US 11,454,658 B2
(45) Date of Patent: Sep. 27, 2022

(54) LOAD ESTIMATING DEVICE AND POWER GENERATOR

(71) Applicant: HONDA MOTOR CO., LTD., Tokyo (JP)

(72) Inventors: Ryo Oshima, Wako (JP); Nobuyuki Sasaki, Wako (JP); Mitsuhiro Ito, Wako (JP); Mio Oshima, Wako (JP); Yoshihiro Matsunaga, Wako (JP); Sho Takada, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 48 days.

(21) Appl. No.: 17/018,144

(22) Filed: Sep. 11, 2020

(65) Prior Publication Data

US 2020/0408818 A1 Dec. 31, 2020

Related U.S. Application Data

(63) Continuation of application No. PCT/JP2018/044964, filed on Dec. 6, 2018.

(30) Foreign Application Priority Data

Mar. 20, 2018 (JP) .............................. JP2018-052597

(51) Int. Cl.
*G01R 22/06* (2006.01)
*G01R 31/382* (2019.01)
(Continued)

(52) U.S. Cl.
CPC ........... *G01R 22/063* (2013.01); *G01F 23/00* (2013.01); *G01R 31/382* (2019.01); *G04F 10/00* (2013.01)

(58) Field of Classification Search
CPC .. G01R 31/367; G01R 31/382; G01R 22/063; G04F 10/00; Y02T 10/70; Y02T 10/40;
(Continued)

(56) References Cited

U.S. PATENT DOCUMENTS

| 11,218,103 B2* | 1/2022 | Donolo ..................... H02P 6/22 |
| 2002/0024332 A1* | 2/2002 | Gardner .................... H02J 3/14 |
| | | 324/103 R |

(Continued)

FOREIGN PATENT DOCUMENTS

| JP | 2000-292465 A | 10/2000 |
| JP | 2007-3296 A | 1/2007 |

(Continued)

OTHER PUBLICATIONS

International Search Report dated Jan. 29, 2019, issued in counterpart International Application No. PCT/JP2018/044964. (2 pages).

*Primary Examiner* — Giovanni Astacio-Oquendo
(74) *Attorney, Agent, or Firm* — WHDA, LLP (57) ABSTRACT

A load estimating device measures a voltage and a current supplied to a load connected with a generator, calculates a feature amount of the load, senses a remaining amount of fuel, outputs a time during which the load is continuously operable. The device estimates what the load connected with the generator is, based on the calculated feature amount and the feature amounts stored in a storage, and determines the time during which the estimated load is continuously operable, based on a power consumption of the estimated load, and the remaining amount of fuel. The device has a load registration mode for causing the storage to store therein a feature amount of a new load that is not stored in a storage.

8 Claims, 9 Drawing Sheets

(51) Int. Cl.
*G01F 23/00* (2022.01)
*G04F 10/00* (2006.01)

(58) Field of Classification Search
CPC ..... Y02T 10/62; Y02T 10/72; Y02T 10/7072; Y02T 10/84; B60W 10/08; B60W 50/0097; B60W 2510/244; B60W 10/26; B60W 20/00; B60W 20/11; B60W 20/20; H01M 2250/20; H01M 2250/402; B60L 15/2045; B60L 58/12; B60L 58/10; B60L 58/40
USPC ...................................... 324/111, 113, 76.11
See application file for complete search history.

(56) References Cited

U.S. PATENT DOCUMENTS

| | | | |
|---|---|---|---|
| 2011/0153246 A1 | 6/2011 | Donaldson et al. | |
| 2016/0136747 A1* | 5/2016 | Trinkner | F02M 51/005 219/133 |
| 2020/0403439 A1* | 12/2020 | Takada | H02J 9/062 |
| 2021/0003620 A1* | 1/2021 | Oshima | G01R 21/06 |

FOREIGN PATENT DOCUMENTS

| | | | | |
|---|---|---|---|---|
| JP | 2008-109849 A | | 5/2008 | |
| JP | 2011-528121 A | | 11/2011 | |
| JP | 2011-259554 A | | 12/2011 | |
| JP | 2014-3749 A | | 1/2014 | |
| JP | 2014003749 A | * | 1/2014 | |

* cited by examiner

| LOAD IDENTIFYING INFORMATION | RATED POWER CONSUMPTION [W] | TYPICAL POWER AMOUNT [Wh] |
|---|---|---|
| LIGHTING EQUIPMENT | 10 | NA |
| RICE COOKER | 400 | 200 |
| COMPRESSOR | 700 | 70 |
| ELECTRIC KETTLE | 800 | 40 |
| HEATER | 900 | NA |
| DRYER | 1000 | 50 |

FIG. 9

LOAD ESTIMATING DEVICE AND POWER GENERATOR

CROSS-REFERENCE TO RELATED APPLICATION(S)

This application is a continuation of International Patent Application No. PCT/JP2018/044964 filed on Dec. 6, 2018, which claims priority to and the benefit of Japanese Patent Application No. 2018-052597 filed on Mar. 20, 2018, the entire disclosures of which are incorporated herein by reference.

BACKGROUND OF THE INVENTION

Field of the Invention

The present invention relates to a load estimating device for estimating a load connected with a portable power-supplying device such as a power generator and storage battery.

Description of the Related Art

A power generator is configured to be connected with various loads (electric devices). In the case of an engine-driven type power generator, the engine-driven type power generator cannot generate power if fuel runs out. For example, if the fuel runs out before a rice cooker completes cooking of rice, it would result in not only failure of cooking the rice but also wasting the rice. Thus, it is considered that, if it is possible to estimate a type or name of the load connected to the power generator, it would become possible to determine whether or not the power generator still has enough fuel to supply enough power to the load.

Patent Literature 1 describes a configuration for determining an operation state of an electric device by causing a neural network to learn about a fundamental wave and a high harmonic wave of a current and the operation state of the electric device. Paten Literature 2 describes a configuration for determining whether or not a load is in an operation state, by frequency analysis of a fundamental wave and a high harmonic wave of a current.

CITATION LIST

Patent Literature

PTL1: Japanese Patent Laid-Open No. 2000-292465
PTL2: Japanese Patent Laid-Open No. 2007-003296

According to Patent Literature 1, it is necessary to have a vast number of pieces of training data for the leaning of the neural network. In the first place, Patent Literature 1 is not a technique for determining the type of load. Patent Literature 2 requires the frequency analysis, thereby requiring a huge amount of calculation. Moreover, Patent Literature 2 is also not a technique for determining the type of load. In view of these, an object of the present invention is to attain a simpler method for estimating one or more loads with good accuracy.

SUMMARY OF THE INVENTION

The present invention provides, for example, a load estimating device including: a measuring circuit configured to measures a voltage and a current supplied to a load connected with a power generator; a calculating unit configured to calculate a feature amount of the load from measurement values of the voltage and the current measured by the measuring circuit; a storage device configured to store feature amounts of loads in advance; and a load estimating unit configured to estimate what the load connected with the power generator is, on the basis of the feature amount calculated by the calculating unit and the feature amounts stored in the storage device, wherein the load estimating unit has a load registration mode for causing the storage device to store therein a feature amount of a new load that is not stored in the storage device.

Advantageous Effects of Invention

According to the present invention, it becomes possible to estimate one or more loads with good accuracy by a simpler method.

Further features of the present invention will become apparent from the following description of exemplary embodiments (with reference to the attached drawings).

DESCRIPTION OF EMBODIMENTS

Power-Supplying Device

A power-supplying device is a device capable of supplying power to one or more loads (electric devices). The power-supplying device may be, for example, an engine-driven power generator, a storage battery, an engine-driven power generator provided with a storage battery, or the like. Therefore, the power-supplying device may be, for example, a portable engine-driven power-supplying device. For example, the power-supplying device may be usable outdoors, such as at a campsite. Such a power-supplying device is not supplied with power from a commercial AC power source, and is independent from such a commercial AC power source. For example, the engine-driven power generator can supply power to a load as long as the engine-driven power generator still has fuel. In case of a storage battery, the storage battery can supply power to a load as long as a charge still remains in the storage battery. Moreover, in case of an engine-driven power generator provided with a storage battery, the engine-driven power generator provided with the storage battery can supply power to a load as long as fuel and a charge remain in the engine-driven power generator provided with the storage battery. Note that different loads have different rated power consumptions and different power consumptions. For example, a rice cooker consumes a large amount of power in an initial cooking period, and consumes a small amount of power in a steaming period. A typical power amount necessary for a rice cooker from a start to an end of rice cooking has been known. A power amount necessary for an electric kettle to boil a prescribed amount of water has been known (where a boiling point depending on altitude may be additionally taken into consideration). Therefore, if it becomes possible to estimate a load, it becomes possible to determine, based on a remaining amount of fuel or the like, whether or not an electric device can accomplish a main object (for example, typical operations such as rice cooking and water boiling). For some devices such as lighting devices, heaters, and air compressors, when to use the device may be largely different depending on users. In such a case, a continuous operable time of the electric device can be calculated out on the basis of the rated power consumption of the electric device and the remaining amount of the fuel. The user may give priority to operation of a certain load among loads by stopping a load other than the certain load, referring to the continuous operable time.

Figure 1:
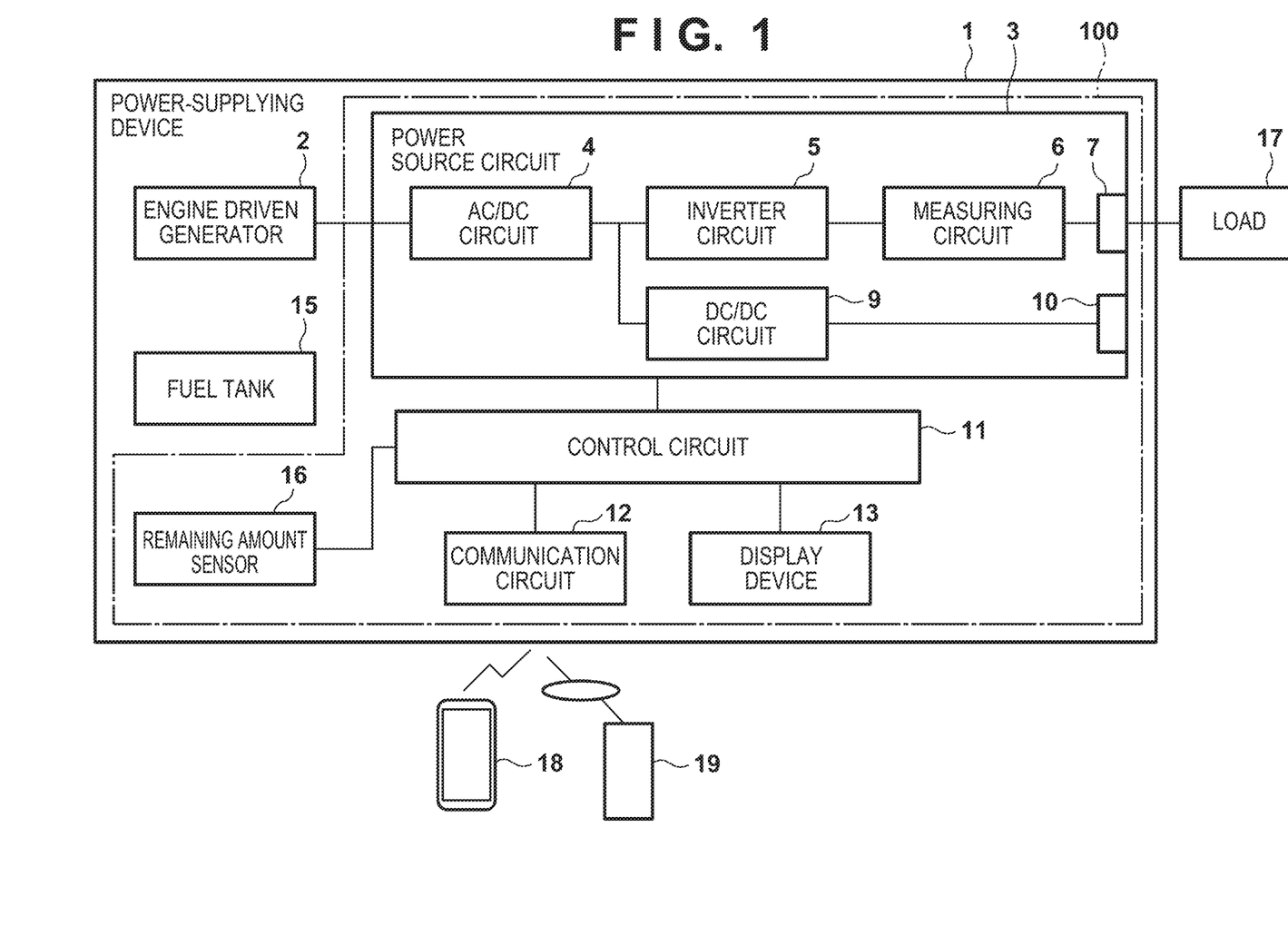
FIG. 1 is a view for explaining a configuration example of a power-supplying device.

FIG. 1 is a block diagram illustrating a power-supplying device 1. An engine-driven power generator 2 is a power generator configured to generate power by being driven by an engine configured to operate, replying on fuel supplied from a fuel tank 15. The fuel may be, for example, gasoline, liquified petroleum gas, hydrogen, or the like. A power source circuit 3 is a circuit configured to convert a voltage generated by the engine-driven power generator 2 into a predetermined alternating current or direct current. An AC/DC circuit 4 includes circuits such as a rectifying and smoothing circuit configured to rectify and smooth the alternating current generated by the engine-driven power generator 2. An inverter circuit 5 is a circuit configured to convert a direct current outputted from the AC/DC circuit 4 or a storage battery 14 into an alternating current having a predetermined stable frequency. A measuring circuit 6 is configured to measure an alternating voltage and an alternating current supplied to a load 17 connected to an AC outlet 7, and to output measurement results to a control circuit 11. The AC outlet 7 may be provided with a plurality of receptacles thereby to be connectable with a plurality of loads 17. Moreover, the AC outlet 7 may be connected with a power source tap, to which a plurality of loads 17 are connectable. A DC/DC circuit 9 is configured to convert a level of the DC voltage outputted from the AC/DC circuit 4, and supplies an operation voltage of the level to a control circuit 11 or the like, or outputs the DC of the level from a DC outlet 10. The control circuit 11 is a circuit configured to control the power source circuit 3, a communication circuit 12, a display device 13, and the like. The communication circuit 12 is a circuit configured to communicate with a smartphone 18 or a PC (personal computer) 19 via wired communication or wireless communication. The PC 19 may be a server device connected with the Internet. The display device 13 is configured to output, for example, information indicating a type of load and the continuous operable time to a user. The display device 13 may include a touch-screen type input device. A remaining amount sensor 16 is configured to gauge a remaining amount of the fuel contained in the fuel tank 15, and to output a measurement result to the control circuit 11. The control circuit 11 is configured to calculate each feature amount of a plurality of loads on the basis of the measurement results of the measuring circuit 6, and to estimate what the loads are (type, name, or the like) on the basis of the feature amounts. The control circuit 11 determines a continuous operable time of the loads on the basis of the remaining amount of fuel and the power consumptions of the load.

Figure 2:
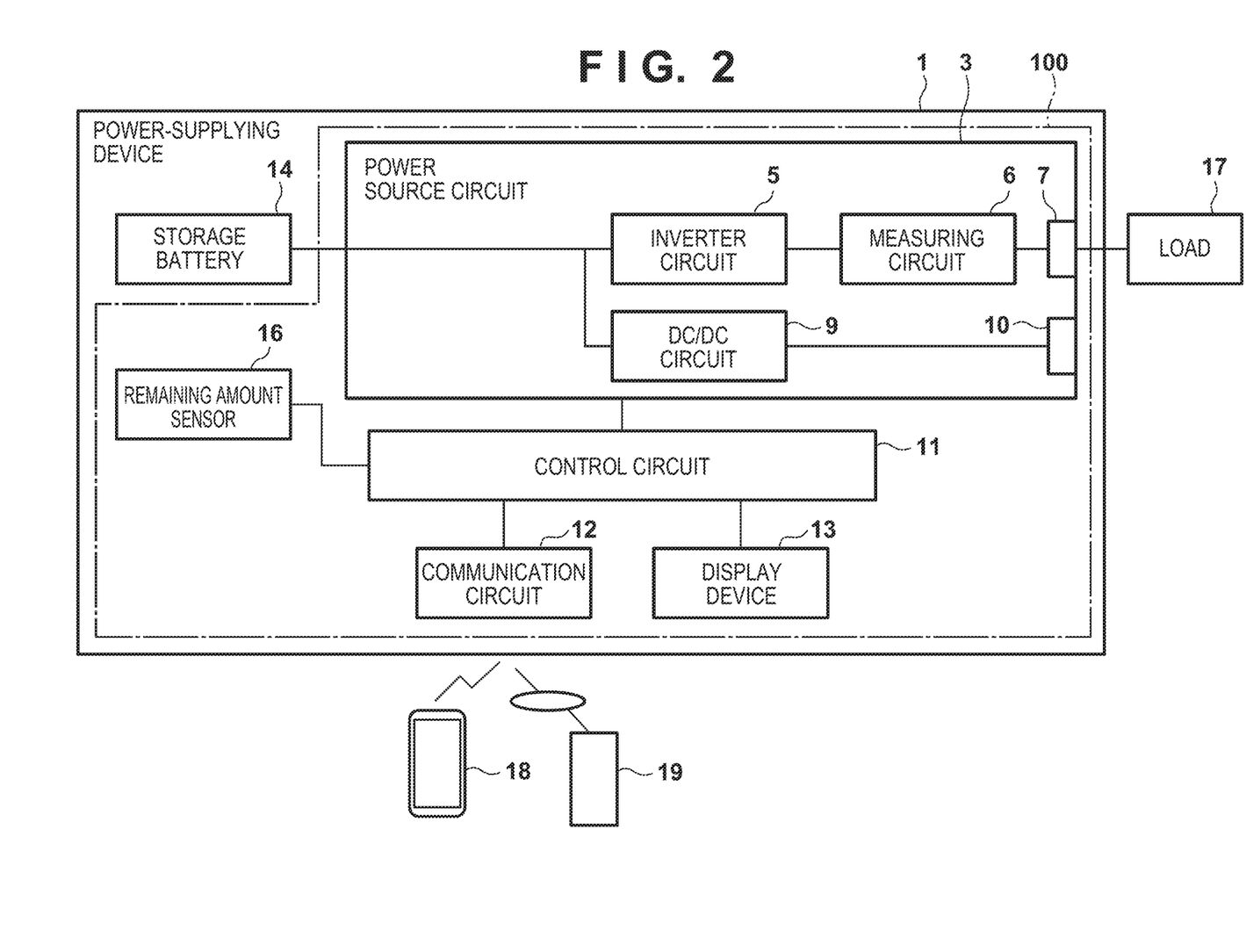
FIG. 2 is a view for explaining a configuration example of a power-supplying device.

FIG. 2 illustrates a power-supplying device 1 including a storage battery 14 instead of the engine-driven power generator 2. Explanation of parts in FIG. 2 which are common with these in FIG. 1 will be omitted here. The storage battery 14 may be, for example, configured to output a DC voltage of, for example, 48 V to the inverter circuit 5 or the DC/DC circuit 9. The remaining amount sensor 16 is configured to gauge a charge level (Ah) of the storage battery 14 by monitoring a voltage [V] of the storage battery 14. In general, the charge level of the storage battery 14 and the voltage thereof are correlated. The remaining amount sensor 16 converts the voltage of the storage battery 14 into the charge level thereof according to the correlation. The control circuit 11 determines, on the remaining charge level of the storage battery and the power consumptions of the loads, a time during which the loads can be continuously operated (hereinafter, which is referred to as the continuous operable time).

Figure 3:
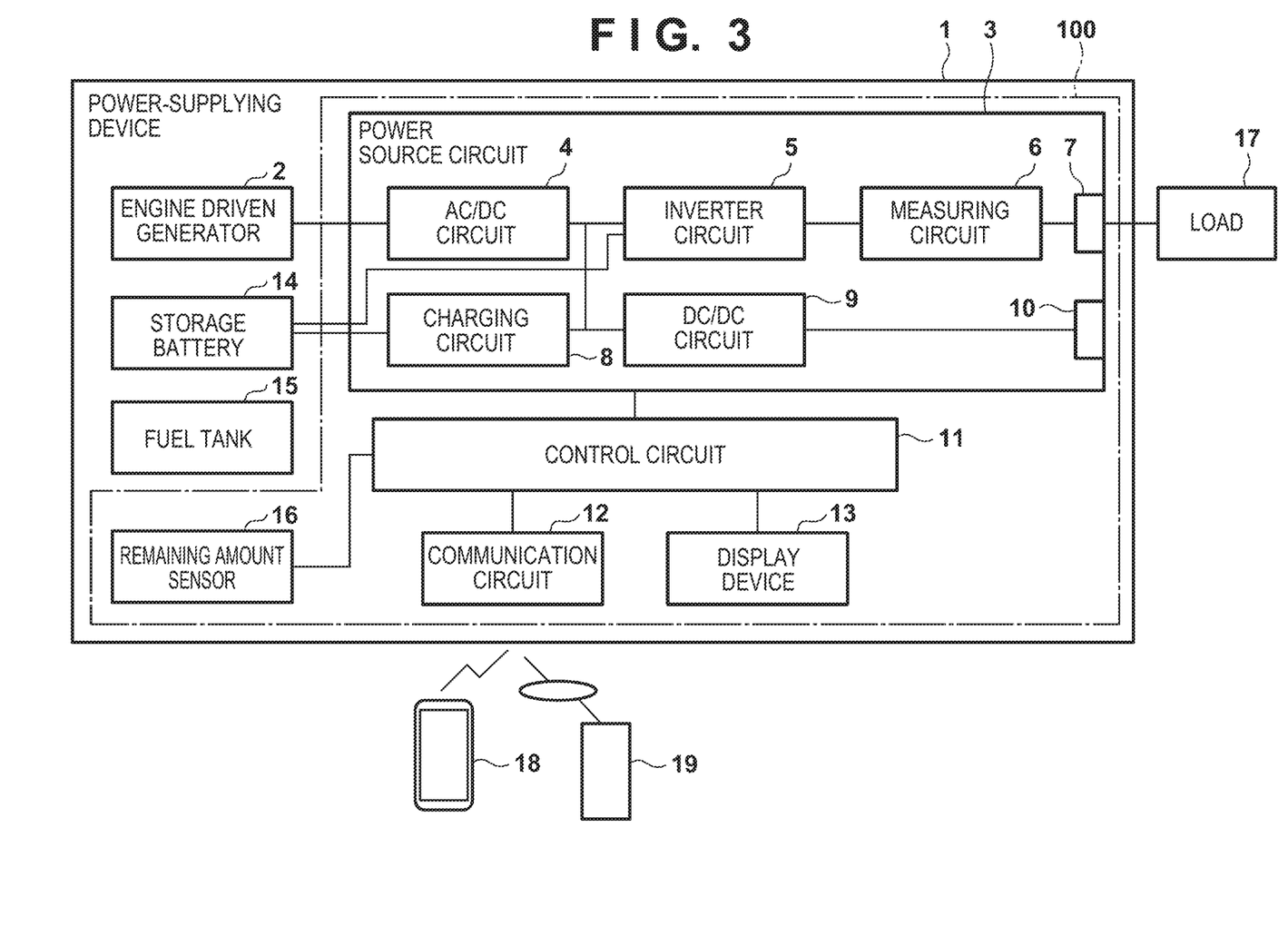
FIG. 3 is a view for explaining a configuration example of a power-supplying device.

FIG. 3 illustrates a power-supplying device 1 provided with an engine-driven power generator 2 and a storage battery 14. Explanation on parts of FIG. 3 which are common with these in FIGS. 1 and 2 will be omitted here. A remaining amount sensor 16 is configured to gauge the remaining amount of the fuel contained in the fuel tank 15 and to gauge a charge level of the storage battery 14. The inverter circuit 5 is configured to convert, into an alternating current, a direct current generated by the AC/DC circuit 4 or a direct current supplied from the storage battery 14. A charging circuit 8 is configured to charge the storage battery 14 with the power generated by the engine-driven power generator 2. The power-supplying device 1 illustrated in FIG. 3 is capable of supplying the power stored in the storage battery 14 to the load 17, even after the fuel runs out. The control circuit 11 is configured to determine the continuous operable time of the loads on the basis of the remaining amount of the fuel, the charge level, and the power consumptions of the loads.

According to FIGS. 1, 2, and 3, the power source circuit 3, the control circuit 11, the remaining amount sensor 16, the communication circuit 12, and the display device 13 constitute a load estimating device 100.

Control Circuit

Figure 4:
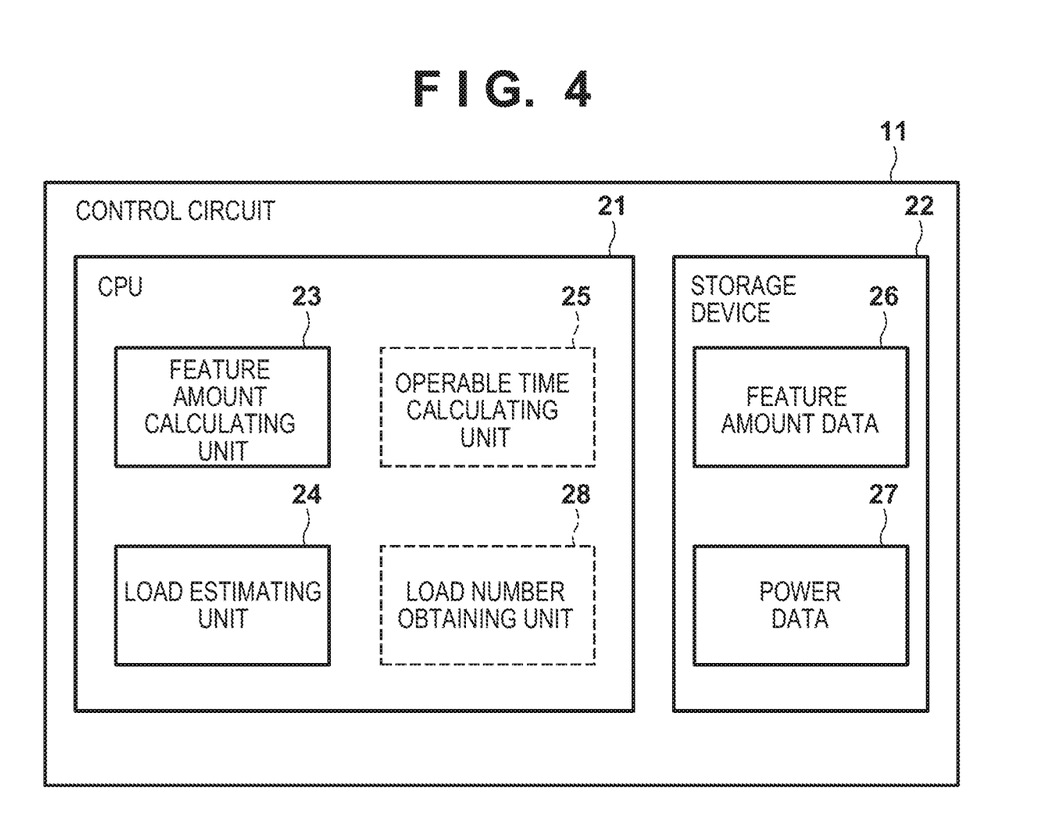
FIG. 4 is a block diagram for explaining a control circuit of the power-supplying device.

FIG. 4 illustrates the control circuit 11. In FIG. 4, the parts indicated with broken lines are optional. A CPU 21 is a processor circuit (central processing unit) configured to control the power-supplying device 1 according to a control program stored in a storage device 22. The storage device 22 is a storage circuit including a non-volatile memory (ROM: Read Only Memory), a volatile memory (RAM: Random Access Memory), or the like. Note that the CPU 21 may be a processor circuitry that may have one or more processors, and/or one or more CPU cores, ASIC (application specific integrated circuits) and/or FPGA (field programmable gate array), and/or one or more combinations of them.

The CPU 21 has a plurality of functions, which can be realized by the control program. Note that, part or all of the functions may be realized by hardware circuits such as DSP (Digital Signal Processor) or FPGA (Field Programmable Gate Array). A feature amount calculating unit 23 is configured to calculate out the feature amounts of the plurality of loads from the measurement value of the voltage and the measurement value of the current measured by the measuring circuit 6. The feature amounts may be, for example, an apparent power and a power factor. The power factor may be obtained by dividing an effective power with the apparent power or may be calculated out as cos θ of a phase difference between the voltage and the current. In the latter case, the measuring circuit 6 measures the phase difference θ. Further, the feature amount may include a stabilization time, which is a time period necessary from activation of the load to stable operation of the load, or a peak value of an activation current, which flows across the load at the activation of the load. The storage device 22 stores therein feature amount data 26 and power data 27. The feature amount data 26 is data in which types or names (or feature amount identifying information) of loads are associated with feature amounts of the loads. Especially, the present invention is configured such that the feature amount data 26 includes feature amounts of combinations of two or more loads. A load estimating unit 24 is configured to estimate what the plurality of loads connected with the power-supplying device 1 are, on the basis of the feature amounts calculated by the feature amount calculating unit 23 and known feature amounts stored in the storage device 22. An operable time calculating unit 25 determines, based on the power consumptions of the plurality of loads estimated by the load estimating unit 24 and the remaining amount of the fuel and/or the charge level, how long the plurality of loads can be continuously operated (continuous operable time). The CPU 21 may be configured to cause the display device 13 to display the continuous operable time thereon, or transmit the continuous operable time to an external information processing device (communication terminal) via the communication circuit 12 so as to cause a display of the external information processing device to display the continuous operable time thereon. The power data 27 may include rated power consumptions of the loads and power amounts necessary for attaining main objects of the loads. A load number obtaining unit 28 is configured to obtain information as to how many loads are connected to the AC outlet 7. The information as to the number of loads may be inputted via the information processing device by a user, or the number of loads may be identified on the basis of changes of currents outputted from the AC outlet 7 over time.

Feature Amount Map

Figure 5:
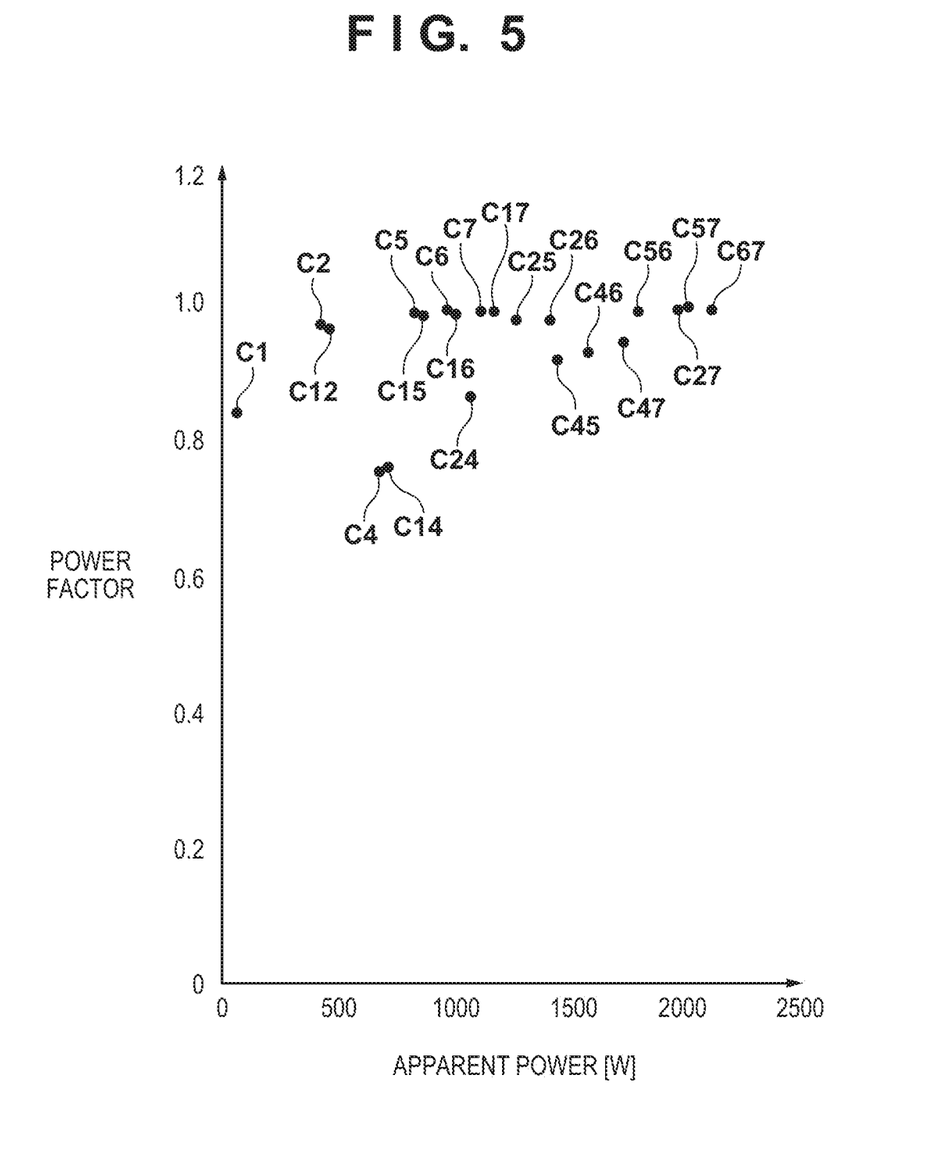
FIG. 5 is view for explaining a feature amount map that may be included in feature amount data.

FIG. 5 illustrates a feature amount map constituting part of the feature amount data 26. Here, the apparent power and the power factor are exemplified as the feature amounts. FIG. 5 illustrates, by dots, coordinates of feature amounts solely of the loads and coordinates of feature amounts of combinations of two or more loads. As a matter of course, dots for coordinates of feature amounts of combinations of three or more loads are omitted for the sake of the simplicity of the illustration of the feature amount map.

A feature amount C1 indicates a feature amount solely of a lighting device.

A feature amount C2 indicates a feature amount solely of a rice cooker.

A feature amount C4 indicates a feature amount solely of a compressor.

A feature amount C5 indicates a feature amount solely of an electric kettle.

A feature amount C6 indicates a feature amount solely of a heater.

A feature amount C7 indicates a feature amount solely of a dryer.

A feature amount C12 indicates a feature amount of a combination of the lighting device and the rice cooker.

A feature amount C14 indicates a feature amount of a combination of the lighting device and the compressor.

A feature amount C15 indicates a feature amount of a combination of the lighting device and the electric kettle.

A feature amount C16 indicates a feature amount of a combination of the lighting device and the heater.

A feature amount C17 indicates a feature amount of a combination of the lighting device and the dryer.

A feature amount C24 indicates a feature amount of a combination of the rice cooker and the compressor.

A feature amount C25 indicates a feature amount of a combination of the rice cooker and the electric kettle.

A feature amount C26 indicates a feature amount of a combination of the rice cooker and the heater.

A feature amount C27 indicates a feature amount of a combination of the rice cooker and the dryer.

A feature amount C45 indicates a feature amount of a combination of the compressor and the electric kettle.

A feature amount C46 indicates a feature amount of a combination of the compressor and the heater.

A feature amount C47 indicates a feature amount of a combination of the compressor and the dryer.

A feature amount C56 indicates a feature amount of a combination of the electric kettle and the heater.

A feature amount C57 indicates a feature amount of a combination of the electric kettle and the dryer.

A feature amount C67 indicates a feature amount of a combination of the heater and the dryer.

The load estimating unit 24 is configured to calculate out a distance between coordinates of the feature amount calculated out by the feature amount calculating unit 23 and coordinates of the feature amounts stored in the storage device 22, and to determine the coordinates of that one of the feature amounts stored in the storage device 22 with which a minimum distance can be obtained. The load estimating unit 24 is configured to obtain the type or name (distinguishing information) of the load associated with the feature amount thus determined. For example, if the load estimating unit 24 determines that the feature amount with which the minimum distance can be obtained is C56, the load estimating unit 24 extracts, from the feature amount data 26, the electric kettle and the heater as the identifying information of the loads corresponding to C56. Here, Ci or Cij are used as reference characters for distinguishing the features amounts, where Ci is used for distinguishing sole loads and Cij is used for distinguishing combinations of two loads. According to this naming rules, the reference characters for distinguishing combinations of three loads will be Cijk. The reference characters for distinguishing combinations of four loads will be Cijkl. A similar naming rule may be applied to combinations of five or more loads. The feature amount Cij is a synthetic vector of the feature amount Ci and the feature amount Cj. In case where the load number obtaining unit 28 has obtained information as to how many the loads are, the load estimating unit 24 may be configured to narrow down comparison candidates to the feature amounts of the combinations of that number of loads. If the number of the loads is 2, Cij is the comparison candidates. If the number of loads is 4, Cijkl is the comparison candidates.

Power Data

The operable time calculating unit 25 is configured to calculate out a remaining operable time [h] basically from an instantaneous value [W] of the power consumption of the whole loads at the moment and a power amount available [Wh] from the remaining amount of the fuel and the charge level, and to output the remaining operable time to the display device 13 or the communication circuit 12 from time to time. However, the operable time calculating unit 25 may calculate out the continuous operable time by using the following method.

Figure 6:
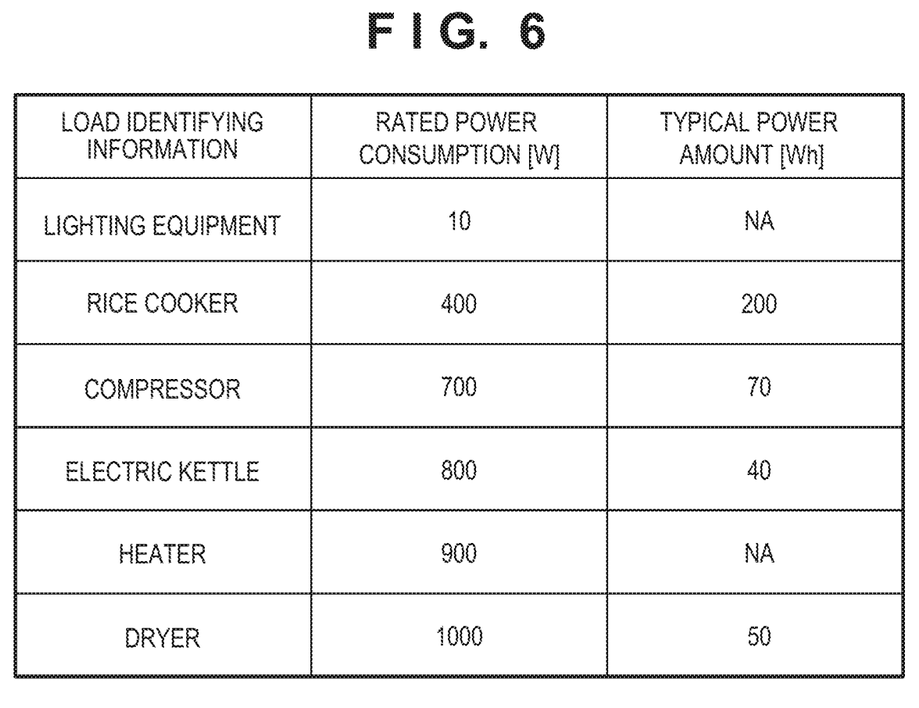
FIG. 6 is a view for explaining power data.

FIG. 6 illustrates one example of the power data 27. The power data 27 includes the rated power consumptions of the loads and typical power amount. The typical power amount is a minimum power amount necessary for accomplishing the main object (typical work) of an electric device. For example, a typical power amount for a rice cooker is a power amount necessary from the start to the end of the rice cooking. For example, if the load estimating unit 24 estimates that the plurality of loads connected with the power-supplying device 1 are an electric kettle and a rice cooker, the operable time calculating unit 25 refers to the power data 27, obtains the rated power consumption of the electric kettle and the rated power consumption of the rice cooker, and adds these rated power consumptions together. The operable time calculating unit 25 calculates out an available power amount from the remaining amount of the fuel and the charge level. Furthermore, the operable time calculating unit 25 calculates out the continuous operable time by dividing the available power amount with the sum of the rated power consumption of the electric kettle and the rated power consumption of the rice cooker, and outputs the continuous operable time to the display device 13 or the communication circuit 12. As an alternative, the operable time calculating unit 25 calculates out an available power amount from the remaining amount of the fuel and the charge level, and if the sum of the rated power consumption of the electric kettle and the rated power consumption of the rice cooker is smaller than the available power amount, the operable time calculating unit 25 outputs, to the display device 13 or the communication circuit 12, information indicating that both of the electric kettle and the rice cooker can accomplish the main objects, respectively. If the sum of the rated power consumption of the electric kettle and the rated power consumption of the rice cooker is larger than the available power amount, the operable time calculating unit 25 outputs, to the display device 13 or the communication circuit 12, information (such as warning message) indicating that both of the electric kettle and the rice cooker cannot accomplish the main objects, respectively. The warning message may be outputted from a speaker or a buzzer as a voice message or a warning sound.

Flow Chart

Figure 7:
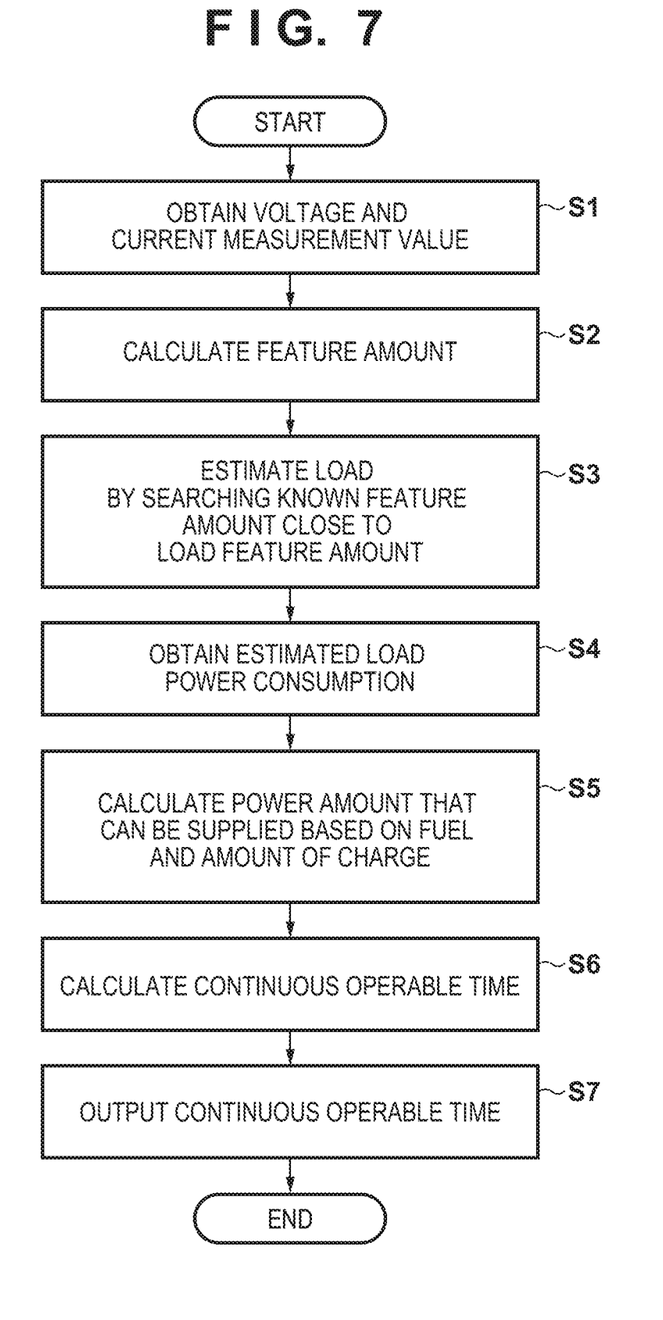
FIG. 7 is a flowchart illustrating a load estimating method.

FIG. 7 illustrates a load estimating method performed by the CPU 21 according to the control program.

At Step S1, the CPU 21 (the feature amount calculating unit 23) obtains, by using the measuring circuit 6, the measurement values of the voltage and current supplied to the loads 17.

At Step S2, the CPU 21 (the feature amount calculating unit 23) obtains the feature amounts (for example, the power factors or the apparent powers) of the loads 17 by using the measurement values of the voltage and current.

At Step S3, the CPU 21 (the load estimating unit 24) estimates what the loads 17 are, by searching for known feature amounts close to the feature amounts of the loads 17. As described above, the storage device 22 stores therein the feature amount data 26 including known feature amounts. Therefore, the load estimating unit 24 determines the feature amounts close to the feature amounts of the loads 17 from among the feature amount data 26, and obtains the identifying information of the loads associated with the known feature amounts thus determined. The identifying information of the loads may be the names or types of the loads, Ci, Cij, or the like for example.

At Step S4, the CPU 21 (the load estimating unit 24 or the operable time calculating unit 25) obtains from the power data 27 the power consumptions of the loads thus estimated. As illustrated in FIG. 6, the power data 27 includes the rated power consumptions in association with the identifying information of the loads. Thus, the operable time calculating unit 25 obtains, from the power data 27, rated power consumptions corresponding to the identifying information of the loads. If the load estimating unit 24 estimates a combination of a plurality of loads (for example, if Cij or Cijk is estimated), the operable time calculating unit 25 obtains, from the power data 27, the rated power consumptions of the respective ones of the plurality of loads.

At Step S5, the CPU 21 (the operable time calculating unit 25) calculates out the power amount available from the power-supplying device 1. In the case of the power-supplying device 1 as illustrated in FIG. 1, the operable time calculating unit 25 calculates out the power amount available from the power-supplying device 1 on the basis of the remaining amount of fuel detected by the remaining amount sensor 16. In the case of the power-supplying device 1 as illustrated in FIG. 2, the operable time calculating unit 25 calculates out the power amount available from the power-supplying device 1 on the basis of the charge level of the storage battery 14 detected by the remaining amount sensor 16. In the case of the power-supplying device 1 as illustrated in FIG. 3, the operable time calculating unit 25 calculates out the power amount available from the power-supplying device 1 on the basis of the remaining amount of fuel detected by the remaining amount sensor 16 and the charge level of the storage battery 14 detected by the remaining amount sensor 16. A formula or a function for converting the measurement results of the remaining amount sensor 16 may be stored in the storage device 22.

At Step S6, the CPU 21 (the operable time calculating unit 25) calculates out the continuous operable time of the loads thus estimated, by dividing the available power amount with the rated power consumptions of the loads. Instead of the rated power consumptions of the loads, the instantaneous value of the power consumption of the whole loads. The continuous operable time is a time during which the loads thus estimated can operate continuously (in a non-stopped manner).

At Step S7, the CPU 21 (the operable time calculating unit 25) outputs the continuous operable time to the display device 13 or the communication circuit 12. The operable time calculating unit 25 may be configured to output the continuous operable time together with the identifying information of the loads. Moreover, the operable time calculating unit 25 may be configured to determine whether or not the available power amount is equal to or more than the typical power amount of the loads thus estimated, in order to determine whether or not the loads thus estimated can accomplish the main objects (typical operations of the loads). If the available power amount is smaller than the typical power amount of the loads thus estimated, the operable time calculating unit 25 may output warning that indicates that the loads thus estimated cannot accomplish the main objects (typical operations of the loads). For example, warning indicating that the rice cooker cannot accomplish the rice cooking may be outputted.

Load Registration Mode

Types of electric devices are increasing every year. Thus, the number of electric devices that would be possibly connected with the power-supplying device 1 is also increased. On the other hand, the load estimating unit 24 is capable of estimating a load identical with or similar to the load registered in the feature amount data 26. In other words, it is difficult for the load estimating unit 24 to accurately estimate a load not registered in the feature amount data 26. Thus, the load estimating unit 24 may have a learning function for learning loads.

Figure 8:
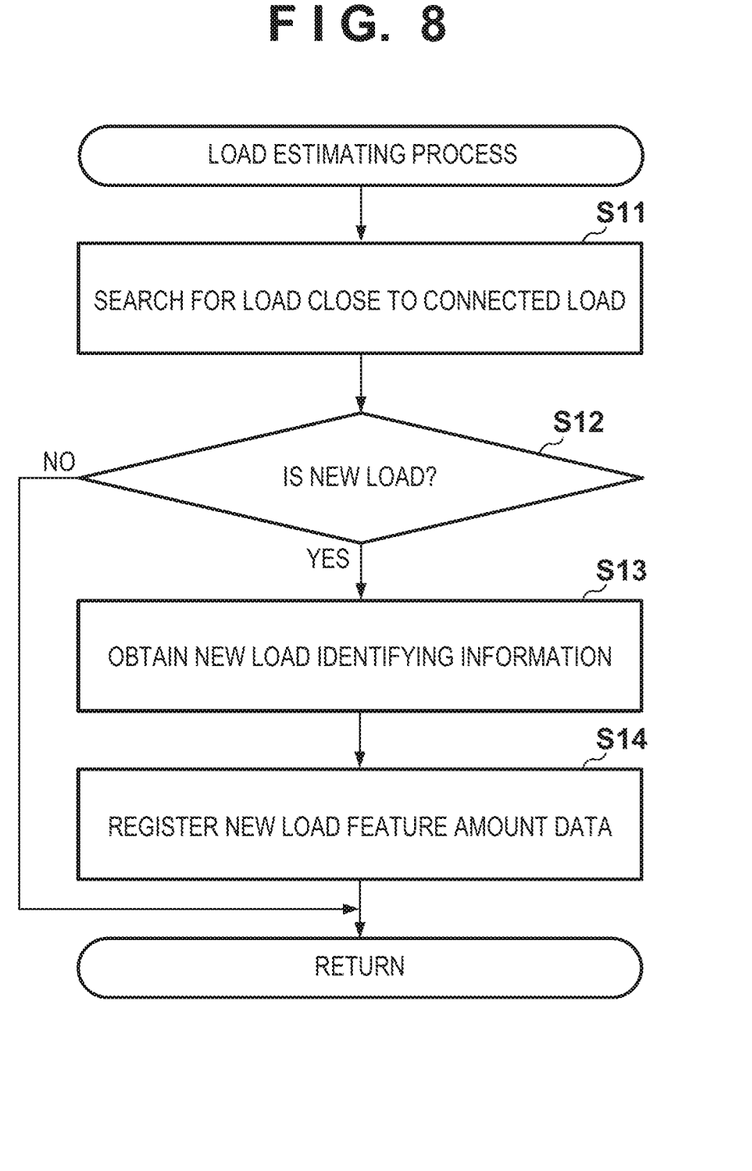
FIG. 8 is a flowchart illustrating a load estimating process including load registration.

FIG. 8 illustrates a load estimating process relating to S3.

At Step S11, the CPU 21 (the load estimating unit 24) estimates what the loads 17 are, by searching for known feature amounts close to the feature amounts of the loads 17. As described above, the storage device 22 stores therein the feature amount data 26 including known feature amounts. Therefore, the load estimating unit 24 determines the known feature amounts close to the feature amounts of the loads 17 from among the feature amount data 26, and obtains the identifying information of the loads associated with the known feature amounts thus determined. That is, the load estimating unit 24 works out a distance between a feature amount of a load 17 and each of a plurality of feature amounts stored in the storage device 22, and finds a known feature amount and a load, with which the feature amount of the load 17 has a shortest distance.

At Step S12, the CPU 21 (the load estimating unit 24) determines whether or not the load 17 is a new load. For example, the load estimating unit 24 works out a distance between the feature amount of the load 17 on the feature amount map illustrated in FIG. 5, and the feature amount thus estimated and determines whether or not the distance exceeds a threshold. This threshold is a threshold for distinguishing a new load and the known loads, and has been predetermined.

Figure 9:
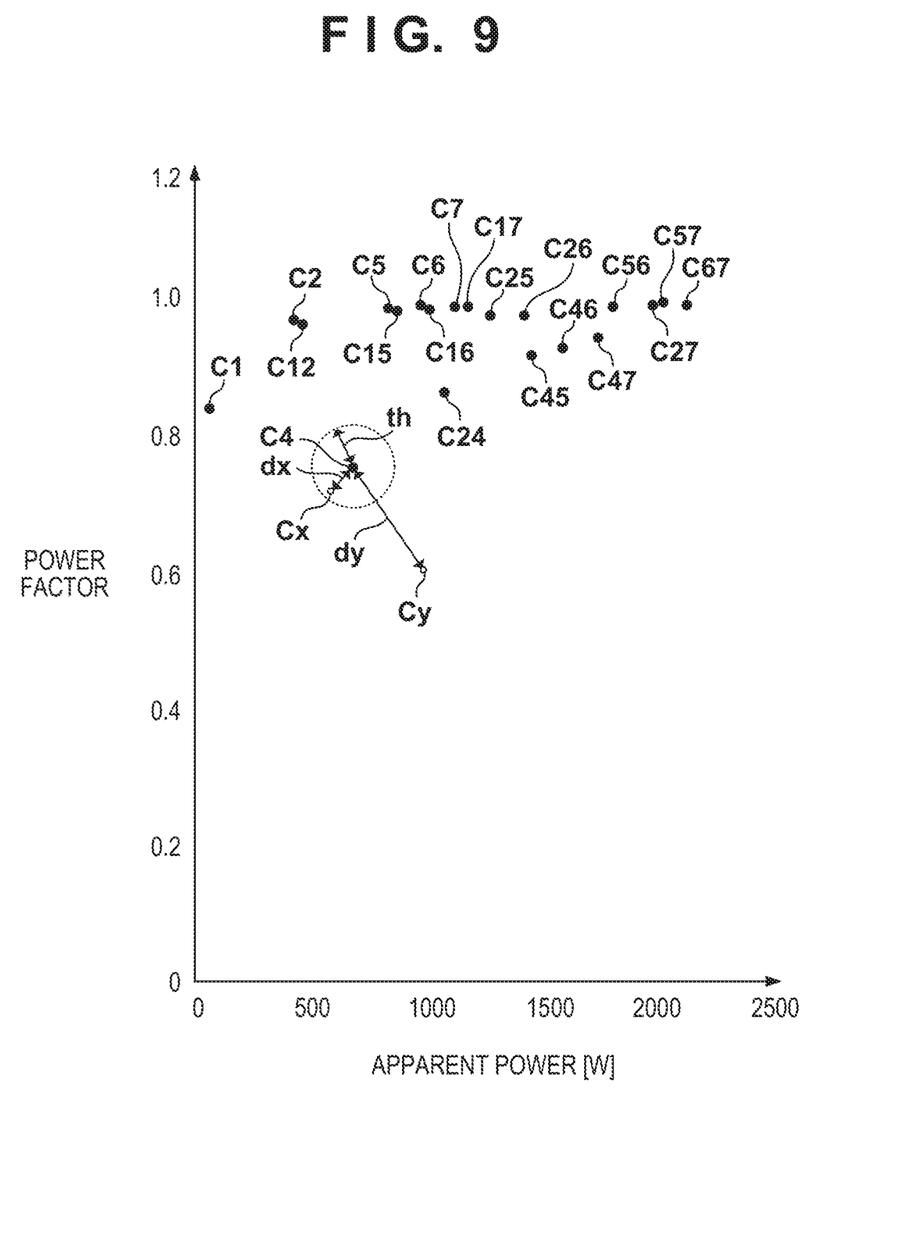
FIG. 9 is a view for explaining a method for determining a new load on the feature amount map.

FIG. 9 is a view illustrating a method for determining the new load. Explanation on parts in FIG. 9, which are common with FIG. 5, will be omitted here. Here, th is the threshold for determining a new load. Here, a feature amount Cx of a load x and a feature amount Cy of a load y are exemplified as the loads 17 connected with the power-supplying device 1. For the feature amount Cx of the load x, the load estimating unit 24 determines the feature amount C4, which is the closest to the feature amount Cx. Here, a distance dx between the feature amount Cx and the feature amount C4 is shorter than the other distances between the feature amount Cx and the other feature amounts C14 etc. That is, the distance dx is the shortest distance. The load estimating unit 24 determines whether or not the distance dx exceeds the threshold th. As illustrated in FIG. 9, the feature amount Cx of the load x is located within a circuit centered at the feature amount C4 of the load C4 and having a radius of th. Thus, the load estimating unit 24 determines the load x is a known load (for example, a compressor). On the other hand, for the feature amount Cy of the load y, the load estimating unit 24 works out the feature amount C4, which is closest to the feature amount Cy. A distance dy between the feature amount Cy and the feature amount C4 exceeds the threshold th. Thus, the load estimating unit 24 determines that the load y is a new load.

If the distance exceeds the threshold, the load estimating unit 24 determines that the load 17 in question is a new load, and goes to Step S13. On the other hand, if the distance does not exceed the threshold, the load estimating unit 24 determines that the load 17 in question is a known load, and goes to Step S4, skipping Steps S13 and S14.

At Step S13, the CPU 21 (load estimating unit 24) obtains identifying information and the like of the new load. For example, the load estimating unit 24 may be configured to obtain the identifying information, the rated power consumption, and the typical power amount of the new load from the smartphone 18 connected with the communication circuit 12. The user reads specification information engraved or printed as to the load, and inputs the information regarding the load in question by operating a keyboard of the smartphone 18 or using voice input of the smartphone 18. The load estimating unit 24 may be configured to obtain the information regarding the load from the server device such as the PC 19 connected with the communication circuit 12.

At Step S14, the CPU 21 (the load estimating unit 24) registers the new load in the feature amount data 26 and the power data 27. For example, the load estimating unit 24 registers the feature amount of the load 17 and the identifying information of the load in the feature amount data 26 in such a way that the feature amount of the load 17 and the identifying information of the load are associated with each other. Furthermore, the load estimating unit 24 registers the feature amount of the load 17 and the identifying information of the load in the power data 27 in such a way that the feature amount of the load 17 and the identifying information of the load are associated with each other. The load estimating unit 24 may be configured to work out a synthetic feature amount by combining a feature amount of a known load and the feature amount of the new load, and add the synthetic feature amount in the feature amount data 26. The load estimating unit 24 may be configured to upload, to the server device connected with the communication circuit 12, the information regarding the feature amount, the identifying information, the rated power consumption, and the typical power amount of the new load. This makes it possible to configured such that, if a load estimating unit 24 of another power-supplying device 1 finds an unknown load connected with the another power-supplying device 1, this load estimating unit 24 transmits a feature amount of the unknown load to the server, obtains from the server device, the information regarding the feature amount, the identifying information, the rated power consumption, and the typical power amount of the unknown load, and updates the feature amount data 26.

Because the load estimating unit 24 has the learning mode as such, it becomes possible to estimate the load with good accuracy and the continuous operable time of the load with good accuracy even if the load is a new load.

Note that the learning mode of the load estimating unit 24 may be conducted independently of the flowchart illustrated in FIG. 7. For example, the user may operate the smartphone 18 to instruct the CPU 21 (the load estimating unit 24) to start the learning mode. The load estimating unit 24 may output a guidance on the smartphone 18 or the display device 13, the guidance urging the user to connect the new load solely. This is because it would become impossible to calculate the feature amount 23 of the new load correctly if a plurality of loads is connected. After that, the load estimating unit 24 performs Steps S13 and S14.

Summary

A first aspect provides a load estimating device 100. The measuring circuit 6 is one example of a measuring circuit configured to measure a voltage and a current supplied to one load or a plurality of loads connected with a power generator. The feature amount calculating unit 23 is one example of a calculating unit configured to calculate out a feature amount of the one load or feature amounts of the plurality of loads from measurement values of the voltage and current measured by the measuring circuit. The storage device 22 is one example of a storage device configured to store feature amounts solely of loads or of combinations of two or more loads in advance. The load estimating unit 24 is one example of a load estimating unit for estimating what the one load or the plurality of loads connected with the power generator are, on the basis of the feature amount or the feature amounts calculated by the calculating unit and the feature amounts stored in the storage device. According to the first aspect, it becomes possible to estimate the one load or the plurality of loads with good accurately by using a simpler method. Furthermore, the load estimating unit 24 may have a load registering mode for causing the storage device to store a feature amount of a new load that is not stored in the storage device. This would facilitate improvement of accuracies for the load estimation and the estimation of the continuous operable time.

According to a second embodiment, the remaining amount sensor 16 is one example of a measuring circuit configured to measure a remaining amount of fuel contained in a fuel tank 15 for the power generator. The operable time calculating unit 25 is one example of a determining unit configured to determine a time during which the one load or the plurality of loads estimated by the load estimating unit 24 are continuously operable, on the basis of a power consumption of the one load or power consumptions of the plurality of loads, and the remaining amount of fuel. The communication circuit 12 or the display device 13 is one example of an output unit configured to output the time during which the one load or the plurality of loads are continuously operable. With this, it becomes possible for the user to grasp the time during which the one load or the plurality of loads are continuously operable.

According to a third aspect, the power generator may include a storage battery 14 that is chargeable with the power generator and supplies power to the one load or the plurality of loads. The operable time calculating unit 25 may determine the time during which the one load or the plurality of loads are continuously operable, on the basis of a power consumption of the one load or power consumptions of the plurality of loads estimated by the load estimating unit, the remaining amount of fuel, and a charge level of the storage battery. As described above, the power may be supplied from both of the power generator and the storage battery temporally in parallel or temporally in tandem. Even in this case, it becomes possible for the user to grasp the time during which the one load or the plurality of loads are continuously operable.

According to a fourth aspect, the feature amount or the feature amounts may include an apparent power and a power factor. The apparent power and the power factor can be obtained in a relatively short time, compared with feature amounts such as stable time. Thus, this configuration makes it possible to estimate the one load or the plurality of loads in a shorter time. However, the feature amount or the feature amounts may further include a stable time or a peak value of an activation current. The storage device 22 may store therein a feature amount $C_i$ solely of loads, and feature amounts $C_{ij}$, $C_{ijk}$, ... of combinations of two or more loads. If the storage device does not store therein a feature amount solely of a load close to the feature amount calculated out by the calculating unit, the load estimating unit 24 may search for a feature amount of a combination of two or more loads close to the feature amount calculated by the calculating unit. With this, the load estimating unit 24 may estimate a plurality of loads. In such a case where there are no load candidates of sole loads, the searching may search for feature amounts of load candidates of combinations of two or more loads, gradually increasing the number of the loads in the combinations. The load number obtaining unit 28 is one example of an obtaining unit configured to obtain the number of loads connected with the power generator. The load estimating unit 24 may perform the estimation of the plurality of loads after narrowing down comparison candidates to be compared with the feature amounts calculated by the calculating unit to the feature amounts of combinations of the number of loads obtained by the obtaining unit among the features of the combinations of two or more loads stored in the storage device. If the comparison candidates are narrowed down as such, this would further facilitate the completion of the load estimation in a shorter time. Note that the feature amounts may be current waveforms at activating the loads. Only one feature amount may be used among the plural kinds of feature amounts exemplified herein, or two or more of the plural kinds of feature amounts exemplified herein may be used.

According to a fifth aspect, the load estimating device may include: a measuring circuit configured to measure a voltage and a current supplied to one load or a plurality of loads connected with a power-supplying device; a calculating unit configured to calculate out a feature amount of the one load or feature amounts of the plurality of loads from measurement values of the voltage and current thus measured by the measuring circuit; a storage device configured to store feature amounts solely of loads or of combinations of two or more loads in advance; and a load estimating unit for estimating what the one load or the plurality of loads connected with the power-supplying device are, on the basis of the feature amount or the feature amounts calculated by the calculating unit and the feature amounts stored in the storage device. According to the fifth aspect, it becomes possible to estimate the one load or the plurality of loads with good accurately by using a simpler method. Furthermore, the load estimating unit 24 may have a load registering mode for causing the storage device to store a feature amount of a new load that is not stored in the storage device. Furthermore, the load estimating unit 24 may have a load registering mode for causing the storage device to store a feature amount of a new load that is not stored in the storage device.

According to a sixth aspect, the load estimating device may include: a sensor configured to sense a power amount available from the power-supplying device; a determining unit configured to determine a time during which the one load or the plurality of loads estimated by the load estimating unit are continuously operable, on the basis of a power consumption of the one load or power consumptions of the plurality of loads, and the power amount. With this, it becomes possible for the user to grasp the time during which the one load or the plurality of loads are continuously operable.

According to a seventh aspect, the load estimating unit may perform a load registration mode (For example: Steps S13 and S14), in case where a shortest distance among distances between the feature amount or the feature amounts calculated by the calculating unit and the feature amounts stored in the storage device exceeds a threshold. If the distance between the feature amounts of known loads and the feature amount of a load connected to the power-supplying device 1 exceeds the threshold, there is a high possibility that the load in question is a new load. Thus, the load registration mode may be started without waiting for a user instruction. This would reduce a burden of the user.

According to an eighth aspect, the load estimating device may further include an input device for receiving an input of the instruction of the load registration. The input device may be the display device 13 (touch screen input device) connected with the control circuit 11, or may be the smartphone 18 or the PC 19 connected to the control circuit 11 via the communication circuit 12. The load estimating unit may be configured to perform the load registration mode if the instruction of the load registration is inputted via the input device. In this way, the user may input a load registration instruction. It is highly probable that the user knows where or not the load connected with the power-supplying device 1 is a new load. Thus, if the start of the load registration mode is triggered with the user's instruction, it would become possible to perform the registration of the feature amount of the new load with good accuracy.

According to a ninth aspect, the power-supplying device may be a power generator, a storage battery, or a power generator including a storage battery. As such, the ninth aspect provides a load estimating device for various power-supplying devices.

A tenth aspect provides a power-supplying device 1, including the load estimating device according to any one of the first to ninth aspect. Such a load estimating device may be provided in such a way that the load estimating device is integrated in the power-supplying device 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A load estimating device, comprising:
   a measuring circuit configured to measure a voltage and a current supplied to a load connected with a power generator;
   one or more processors configured to calculate a feature amount of the load from measurement values of the voltage and the current measured by the measuring circuit;
   a storage device configured to store feature amounts of loads in advance; and
   a sensor configured to sense a remaining amount of fuel contained in a fuel tank for the power generator;
   wherein the one or more processors are further configured to:
      estimate what the load connected with the power generator is, on the basis of the feature amount calculated by the one or more processors and the feature amounts stored in the storage device;
      determine a time during which the load estimated by the one or more processors is continuously operable, on the basis of a power consumption of the load, and the remaining amount of fuel; and
      output the time during which the load is continuously operable, and
   wherein the one or more processors have a load registration mode and are further configured to:
      determine that the load connected with the power generator is a new load based on the feature amount of the load connected with the power generator and the feature amounts stored in the storage device;
      store in the storage device a feature amount of the new load that has not been stored in the storage device to register the feature amount of the new load in a case where the load connected with the power generator is the new load.

2. The load estimating device according to claim 1, wherein
   the power generator further includes a storage battery that is chargeable with the power generator and supplies power to the load, and
   the one or more processors further is configured to determine the time during which the load estimated by the one or more processors is continuously operable, on the basis of the power consumption of the load, the remaining amount of fuel, and a charge level of the storage battery.

3. The load estimating device according to claim 1, wherein
   the feature amount includes an apparent power and a power factor.

4. The load estimating device according to a claim 1, wherein
   the one or more processors perform the load registration mode in case where a shortest distance among distances between the feature amount calculated by the one or more processors and the feature amounts stored in the storage device exceeds a threshold.

5. The load estimating device according to claim 1, further comprising
   an input device configured to input instruction of load registration,
   wherein the one or more processors perform the load registration mode if instruction of load registration is inputted via the input device.

6. A load estimating device comprising:
   a measuring circuit configured to measure a voltage and a current supplied to a load connected with a power-supplying device;
   one or more processors configured to calculate a feature amount of the load from measurement values of the voltage and the current measured by the measuring circuit;
   a storage device configured to store feature amounts of loads in advance;
   a sensor configured to sense a power amount available from the power-supplying device,
   the one or more processors is further configured to:
      estimate what the load connected with the power-supplying device is, on the basis of the feature amount calculated by the one or more processors and the feature amounts stored in the storage device,
      determine a time during which the load estimated by the one or more processors is continuously operable, on the basis of a power consumption of the load, and the power amount; and
      output the time during which the load is continuously operable,
   wherein the one or more processors have a load registration mode and are further configured to:
      determine that the load connected with the power-supplying device is a new load based on the feature amount of the load connected with the power-supplying device and the feature amounts stored in the storage device;
      store in the storage device a feature amount of the new load that has not been stored in the storage device to register the feature amount of the new load in a case where the load connected with the power-supplying device is the new load.

7. The load estimating device according to claim 6, wherein
the power-supplying device is a power generator, a storage battery, or a power generator including a storage battery.

8. A power generator apparatus comprising
a load estimating device including:
  a measuring circuit configured to measure a voltage and a current supplied to a load connected with a power generator;
  one or more processors configured to calculate a feature amount of the load from measurement values of the voltage and the current measured by the measuring circuit;
  a storage device configured to store feature amounts of loads in advance; and
  a sensor configured to sense a remaining amount of fuel contained in a fuel tank for the power generator,
wherein the one or more processors are further configured to:
  estimate what the load connected with the power generator is, on the basis of the feature amount calculated by the one or more processors and the feature amounts stored in the storage device;
  determine a time during which the load estimated by the one or more processors is continuously operable, on the basis of a power consumption of the load, and the remaining amount of fuel; and
  output the time during which the load is continuously operable,
wherein the one or more processors have a load registration mode and are further configured to:
  determine that the load connected with the power generator is a new load based on the feature amount of the load connected with the power generator and the feature amounts stored in the storage device;
  store in the storage device a feature amount of the new load that has not been stored in the storage device to register the feature amount of the new load in a case where the load connected with the power generator is the new load.

* * * * *